United States Patent
Iwamoto

(10) Patent No.: US 11,239,818 B2
(45) Date of Patent: Feb. 1, 2022

(54) ACOUSTIC WAVE DEVICE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 184 days.

(21) Appl. No.: 16/701,183

(22) Filed: Dec. 3, 2019

(65) Prior Publication Data
US 2020/0106416 A1  Apr. 2, 2020

Related U.S. Application Data

(63) Continuation of application No. PCT/JP2018/017440, filed on May 1, 2018.

(30) Foreign Application Priority Data

Jun. 21, 2017  (JP) .............................. JP2017-121721

(51) Int. Cl.
*H03H 9/02* (2006.01)
*H03H 9/05* (2006.01)
(Continued)

(52) U.S. Cl.
CPC .... *H03H 9/02913* (2013.01); *H03H 9/02559* (2013.01); *H03H 9/02866* (2013.01);
(Continued)

(58) Field of Classification Search
CPC ........... H03H 9/02913; H03H 9/02559; H03H 9/02866; H03H 9/059; H03H 9/6483;
(Continued)

(56) References Cited

U.S. PATENT DOCUMENTS

2010/0045145 A1  2/2010  Tsuda
2010/0194488 A1  8/2010  Yoshimoto
(Continued)

FOREIGN PATENT DOCUMENTS

JP  2007-067617 A  3/2007
JP  2010-050539 A  3/2010
(Continued)

OTHER PUBLICATIONS

Official Communication issued in International Patent Application No. PCT/JP2018/017440 dated Jun. 5, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a first acoustic wave element including a first substrate having piezoelectricity at least in a portion thereof, a first functional electrode provided on a first surface of the first substrate, and a first wiring conductor electrically connected to the first functional electrode. The first acoustic wave element further includes a relay electrode on the first surface of the first substrate and electrically connected to a second wiring conductor, and a ground electrode on the first surface of the first substrate and electrically connected to the first functional electrode. The ground electrode is between at least one of the first functional electrode and the first wiring conductor, and the relay electrode, and is electrically insulated from the relay electrode.

18 Claims, 10 Drawing Sheets

(51) Int. Cl.
*H03H 9/64* (2006.01)
*H03H 9/72* (2006.01)

(52) U.S. Cl.
CPC .......... *H03H 9/059* (2013.01); *H03H 9/0547* (2013.01); *H03H 9/6483* (2013.01); *H03H 9/725* (2013.01)

(58) Field of Classification Search
CPC .. H03H 9/725; H03H 9/02574; H03H 9/0576; H03H 9/0571; H03H 9/706; H03H 9/703; H03H 9/542; H03H 9/72; H03H 9/1071; H03H 9/0547
USPC .......................... 333/133, 187, 188, 193–196
See application file for complete search history.

(56) References Cited

U.S. PATENT DOCUMENTS

| | | |
|---|---|---|
| 2014/0111286 A1 | 4/2014 | Taniguchi et al. |
| 2015/0381142 A1 | 12/2015 | Ri |
| 2017/0331455 A1 | 11/2017 | Kuroyanagi |
| 2017/0346463 A1* | 11/2017 | Hatakeyama ...... H03H 9/02086 |
| 2018/0123556 A1 | 5/2018 | Takamine |

FOREIGN PATENT DOCUMENTS

| | | |
|---|---|---|
| JP | 2010-178306 A | 8/2010 |
| JP | 2016-012796 A | 1/2016 |
| JP | 2017-204827 A | 11/2017 |
| WO | 2016/208447 A1 | 12/2016 |

* cited by examiner

ACOUSTIC WAVE DEVICE

CROSS REFERENCE TO RELATED APPLICATIONS

This application claims the benefit of priority to Japanese Patent Application No. 2017-121721 filed on Jun. 21, 2017 and is a Continuation Application of PCT Application No. PCT/JP2018/017440 filed on May 1, 2018. The entire contents of each application are hereby incorporated herein by reference.

BACKGROUND OF THE INVENTION

1. Field of the Invention

The present invention relates to an acoustic wave device and, more particularly, to an acoustic wave device having a laminated structure including a plurality of acoustic wave elements.

2. Description of the Related Art

A piezoelectric component described in Japanese Unexamined Patent Application Publication No. 2010-50539 will be exemplified as an example of an acoustic wave device in the related art. The piezoelectric component described in Japanese Unexamined Patent Application Publication No. 2010-50539 has three piezoelectric elements. The piezoelectric element includes a wiring electrode having a comb-teeth electrode and an element wiring on a main surface of a piezoelectric substrate, and an electrode terminal connected to the wiring electrode. The piezoelectric component is laminated so that a hollow portion is formed between the piezoelectric elements. Additionally, a through-electrode is formed in each piezoelectric substrate. Further, the through-electrode is connected to the electrode terminal, and the piezoelectric substrate is sealed by a resin sealing layer.

In the piezoelectric component (acoustic wave device) described in Japanese Unexamined Patent Application Publication No. 2010-50539, there is a possibility that a signal passing through a conductor (electrode and wiring) of one acoustic wave element may leak to a conductor of another acoustic wave element. Then, when the signal leakage (cross talk) between the conductors of the acoustic wave element increases, isolation characteristics of the acoustic wave device deteriorates.

SUMMARY OF THE INVENTION

Preferred embodiments of the present invention provide acoustic wave devices that are each capable of reducing or preventing deterioration in isolation characteristics.

An acoustic wave device according to a preferred embodiment of the present invention includes a plurality of acoustic wave elements including a first acoustic wave element and a second acoustic wave element, wherein the second acoustic wave element is laminated on the first acoustic wave element. The first acoustic wave element includes a first substrate having piezoelectricity at least in a portion thereof, a first functional electrode provided on one main surface of the first substrate, and a first wiring conductor provided on the first substrate, and electrically connected to the first functional electrode. The second acoustic wave element includes a second substrate having piezoelectricity at least in a portion thereof, and a second functional electrode provided on one main surface of the second substrate. The first acoustic wave element further includes a relay electrode provided on the one main surface of the first substrate and electrically connected to the second functional electrode, and a ground electrode provided on the one main surface of the first substrate. The ground electrode is provided between at least one of the first functional electrode and the first wiring conductor, and the relay electrode, and is electrically insulated from the relay electrode.

Acoustic wave devices according to preferred embodiments of the present invention are each able to reduce or prevent deterioration in isolation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, acoustic wave devices according to preferred embodiments of the present invention will be described in detail with reference to the accompanying drawings. In the preferred embodiments, a filter device will be exemplified as a preferred embodiment of the acoustic wave device in which reception signals received by one antenna are divided into a plurality of frequency bands, and outputted for each frequency band. Note that, structures described in the following preferred embodiments are merely non-limiting examples of the present invention. The present invention is not limited to the following preferred embodiments, and various changes can be made in accordance with a design or the like, as long as one or more of the advantageous effects of the present invention can be achieved.

Figure 1:
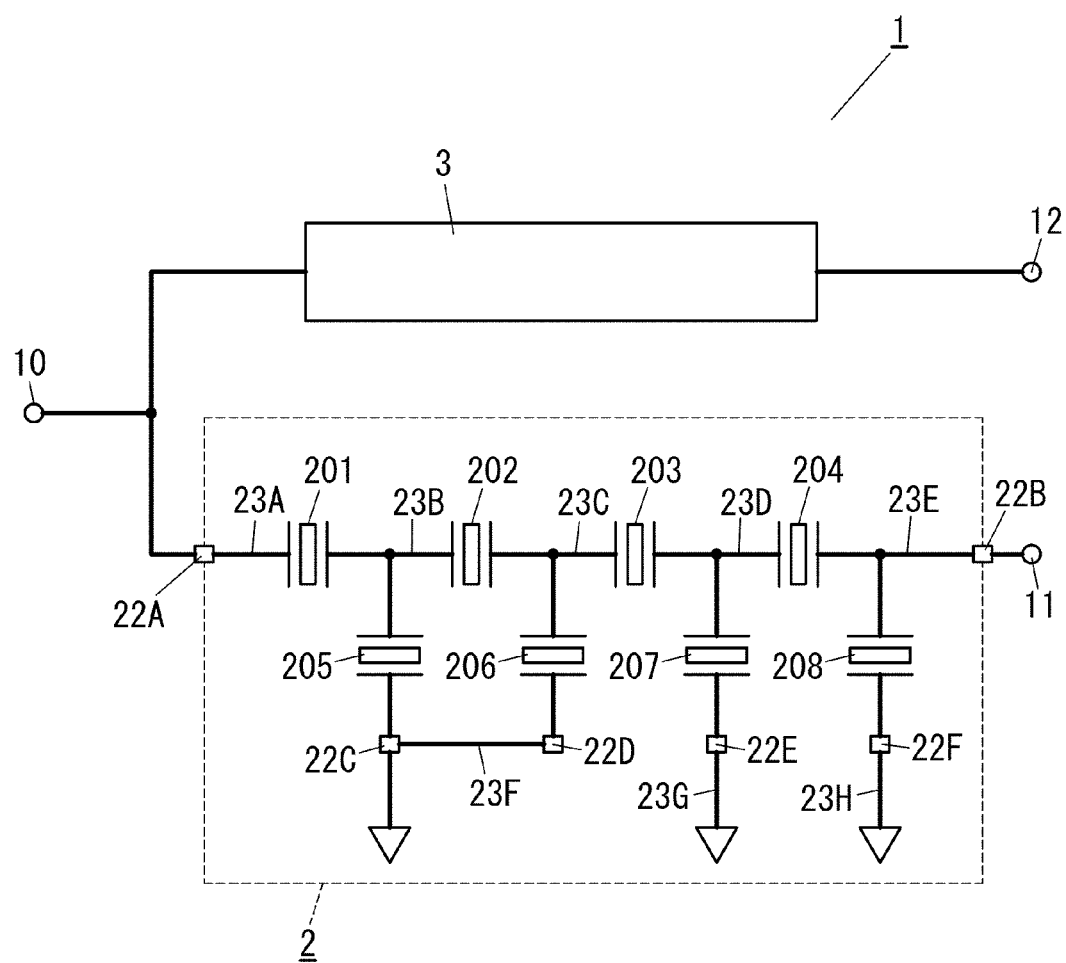
FIG. 1 is a circuit configuration diagram of an acoustic wave device according to a preferred embodiment of the present invention.

An acoustic wave device 1 according to a preferred embodiment of the present invention, as illustrated in FIG. 1, includes a first filter 2 that is a first acoustic wave element, and a second filter 3 that is a second acoustic wave element. The first filter 2 passes only a reception signal in a first frequency band (hereinafter, referred to as a first reception signal) from among reception signals inputted from an antenna terminal 10, and outputs the signal from a first output terminal 11. The second filter 3 passes only a reception signal in a second frequency band (hereinafter, referred to as a second reception signal) from among reception signals inputted from the antenna terminal 10, and outputs the signal from a second output terminal 12. Note that, the second frequency band is preferably, for example, a frequency band lower than the first frequency band.

The first filter 2 in the present preferred embodiment is preferably, as illustrated in FIG. 1, a ladder acoustic wave filter including four series arm resonators 201, 202, 203, 204, and four parallel arm resonators 205, 206, 207, and 208 that are connected. The second filter 3 is preferably, for example, a ladder acoustic wave filter having a pass band lower than a pass band of the first filter 2. Note that, the pass band of the first filter 2 includes the first frequency band, and the pass band of the second filter 3 includes the second frequency band. However, the first filter 2 and the second filter 3 may be acoustic wave filters other than ladder filters.

Each of the four series arm resonators 201 to 204 and the four parallel arm resonators 205 to 208 includes a functional electrode (first functional electrode 21). The first functional electrode 21 includes, for example, an interdigital transducer (IDT) electrode, and two reflectors provided on both sides in a propagation direction of an acoustic wave of the IDT electrode respectively. Further, an acoustic wave in the following description includes not only a surface acoustic wave, but also a bulk acoustic wave, a boundary acoustic wave, and the like.

Figure 2:
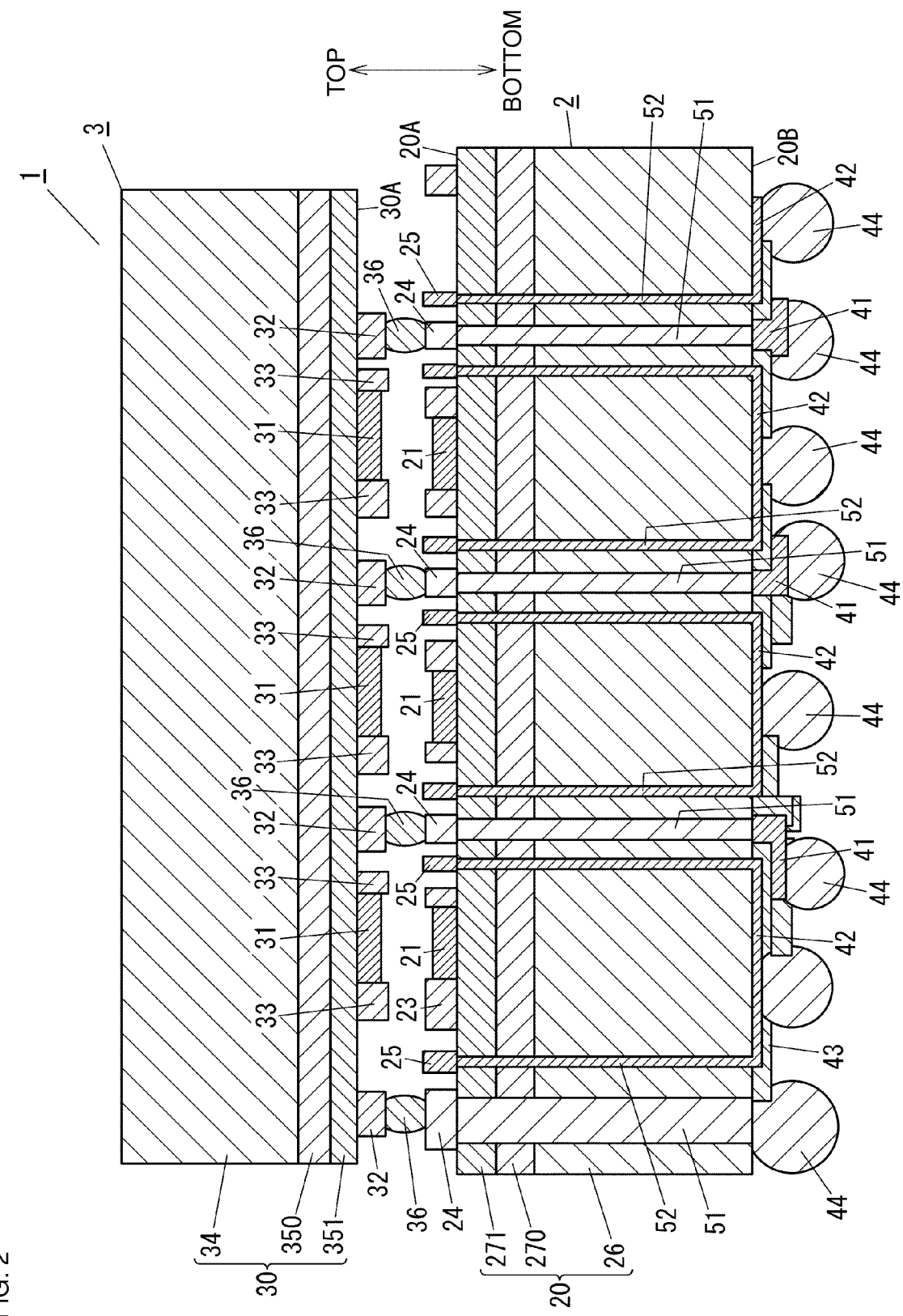
FIG. 2 is a cross-sectional view of the above-described acoustic wave device.

Next, the structure of the acoustic wave device 1 will be described in detail. The acoustic wave device 1, as illustrated in FIG. 2, is configured such that the first filter 2 and the second filter 3 are laminated in a predetermined direction (top-bottom direction in FIG. 2). Since the acoustic wave device 1 has laminated structure including a plurality of filters (acoustic wave elements), it is possible to reduce an occupied area when the acoustic wave device 1 is mounted on a printed wiring board or the like. Note that, FIG. 2 to FIG. 10 that are referred to in the following descriptions are diagrams schematically illustrating the acoustic wave device 1, and ratios of sizes and thicknesses of each element in the figures do not always reflect actual dimension ratios.

First, the structure of the second filter 3 will be described. The second filter 3 includes a second substrate 30 having piezoelectricity at least in a portion thereof, and a plurality of second functional electrodes 31 provided on a first surface 30A (lower surface in FIG. 2) of the second substrate 30. The second filter 3 further includes a plurality of second signal electrodes 32 provided on the second substrate 30, and a plurality of second wiring conductors 33 electrically connecting the second functional electrode 31 to the second signal electrode 32. The plurality of second signal electrodes 32 and the plurality of second wiring conductors 33 are provided on the first surface 30A of the second substrate 30.

The second substrate 30 has laminated structure in which a support substrate 34, a low acoustic velocity film 350, and a piezoelectric film 351 are laminated in this order.

The piezoelectric film 351 is preferably made of, for example, a 50° Y-cut X propagation LiTaO₃ piezoelectric single crystal or piezoelectric ceramic (a lithium tantalate single crystal or ceramic cut by a plane with a normal line that is an axis rotated by about 50° from a Y-axis with an X-axis as a center axis, and an acoustic wave propagates in an X-axis direction in the single crystal or ceramic). A thickness of the piezoelectric film 351 is preferably, for example, about 3.5λ or less, when a wave length of an acoustic wave determined by an electrode finger period of an IDT electrode included in the second functional electrode 31 is λ [m]. For example, the thickness of the piezoelectric film 351 is preferably about 500 nm.

The low acoustic velocity film 350 is made of a material that propagates an acoustic wave (bulk acoustic wave) at a propagation speed lower than a propagation speed of an acoustic wave propagating through the piezoelectric film 351. The low acoustic velocity film 350 is preferably, for example, a dielectric film including silicon dioxide as a main component. A thickness of the low acoustic velocity film 350 is preferably about 2.0λ or less, for example. The thickness of the low acoustic velocity film 350 is preferably, for example, about 670 nm.

The support substrate 34 is made of a material that propagates an acoustic wave (bulk acoustic wave) at a propagation speed higher than a propagation speed of an acoustic wave propagating through the piezoelectric film 351. The support substrate 34 confines an acoustic wave within the piezoelectric film 351 and the low acoustic velocity film 350 so as not to leak the acoustic wave upward the support substrate 34. The support substrate 34 is preferably, for example, a silicon substrate, and a thickness (length in the top-bottom direction in FIG. 2) of the support substrate 34 is preferably, for example, about 120 μm.

On the first surface 30A of the second substrate 30, the plurality of second functional electrodes 31, the plurality of second signal electrodes 32, and the plurality of second wiring conductors 33 are provided. The plurality of second functional electrodes 31 are electrically connected to each other by the plurality of second wiring conductors 33. In addition, each of the second signal electrodes 32 is electrically connected to the corresponding second wiring conductor 33.

According to the laminated structure of the second substrate 30 described above, respective Q values at a resonant frequency and an anti-resonant frequency can be significantly increased, compared to a case where the second substrate 30 is a single layer piezoelectric substrate. That is, since an acoustic wave resonator having a high Q value can be defined by the laminated structure, it is possible to provide a filter with a small insertion loss by using the acoustic wave resonator.

Next, the structure of the first filter 2 will be described. The first filter 2 includes a first substrate 20 having piezoelectricity at least in a portion thereof, a plurality of first functional electrodes 21 provided on a first surface 20A (upper surface in FIG. 2) of the first substrate 20, and a plurality of first signal electrodes 22 provided on the first substrate 20. Further, the first filter 2 includes a plurality of first wiring conductors 23 electrically connecting first ends of the first functional electrodes 21 to the first signal electrodes 22, respectively, and a plurality of relay electrodes 24 provided on the first surface 20A of the first substrate 20 and electrically connected to the respective second signal electrodes 32. Furthermore, the first filter 2 includes a plurality of ground electrodes 25 provided on the first surface 20A of the first substrate 20 and electrically connected to second ends of the first functional electrodes 21, respectively. Here, "the first end of the first functional electrode 21" means one comb-shaped electrode of a pair of comb-shaped electrodes of an IDT electrode included in the first functional electrode 21. Moreover, "the second end of the first functional electrode 21" means another comb-shaped electrode of the pair of comb-shaped electrodes of the IDT electrode.

The first substrate 20 has structure common to that of the second substrate 30. That is, the first substrate 20 has laminated structure in which a support substrate 26, a low acoustic velocity film 270, and a piezoelectric film 271 are laminated in this order. The piezoelectric film 271 is preferably made of, for example, a 50° Y-cut X propagation LiTaO$_3$ piezoelectric single crystal or piezoelectric ceramic (a lithium tantalate single crystal or ceramic cut by a plane with a normal line that is an axis rotated by about 50° from the Y-axis with the X-axis as a center axis, and an acoustic wave propagates in the X-axis direction in the single crystal or ceramic). The low acoustic velocity film 270 is made of a material that propagates an acoustic wave (bulk acoustic wave) at a propagation speed lower than a propagation speed of an acoustic wave propagating through the piezoelectric film 271. The low acoustic velocity film 270 is preferably, for example, a dielectric film including silicon dioxide as a main component. The support substrate 26 is made of a material that propagates an acoustic wave (bulk acoustic wave) at a propagation speed higher than a propagation speed of an acoustic wave propagating through the piezoelectric film 271. The support substrate 26 confines an acoustic wave within the piezoelectric film 271 and the low acoustic velocity film 270 so as not to leak the acoustic wave below the support substrate 26. The support substrate 26 is preferably, for example, a silicon substrate.

Since the first substrate 20 has the laminated structure similar to that of the second substrate 30, respective Q values at a resonant frequency and an anti-resonant frequency can be significantly increased, as compared with a case where the first substrate is defined by a single piezoelectric substrate. That is, since an acoustic wave resonator having a high Q value can be defined by the laminated structure, it is possible to provide a filter with a small insertion loss by using the acoustic wave resonator.

Note that, each of the support substrate 26 of the first filter 2 and the support substrate 34 of the second filter 3 may have structure in which a support substrate and a high acoustic velocity film are laminated. The high acoustic velocity film is a film in which a propagation speed of a bulk wave propagating through the high acoustic velocity film is higher than a propagation speed of an acoustic wave propagating through the piezoelectric film 271 or 351. When each of the support substrates 26 and 34 has laminated structure of a support substrate and a high acoustic velocity film, for the support substrate, piezoelectric materials such as, for example, sapphire, lithium tantalate, lithium niobate, and quartz, various kinds of ceramics such as alumina, magnesia, silicon nitride, aluminum nitride, silicon carbide, zirconia, cordierite, mullite, steatite, and forsterite, a dielectric such as glass, or semiconductors such as silicon and gallium nitride, and resin, and the like, can be used. In addition, for the high acoustic velocity film, various high acoustic velocity materials such as, for example, aluminum nitride, aluminum oxide, silicon carbide, silicon nitride, silicon oxynitride, Diamond-like Carbon (DLC) or diamond, a medium containing the above material as a main component, or a medium containing a mixture of the above materials as a main component, and the like, can be used. Alternatively, the support substrate 26 of the first filter 2 may have structure in which the piezoelectric film 271 is directly laminated on the first surface 20A of the support substrate 26, and the support substrate 34 of the second filter 3 may have structure in which the piezoelectric film 351 is directly laminated on the first surface 30A of the support substrate 34.

Figure 3:
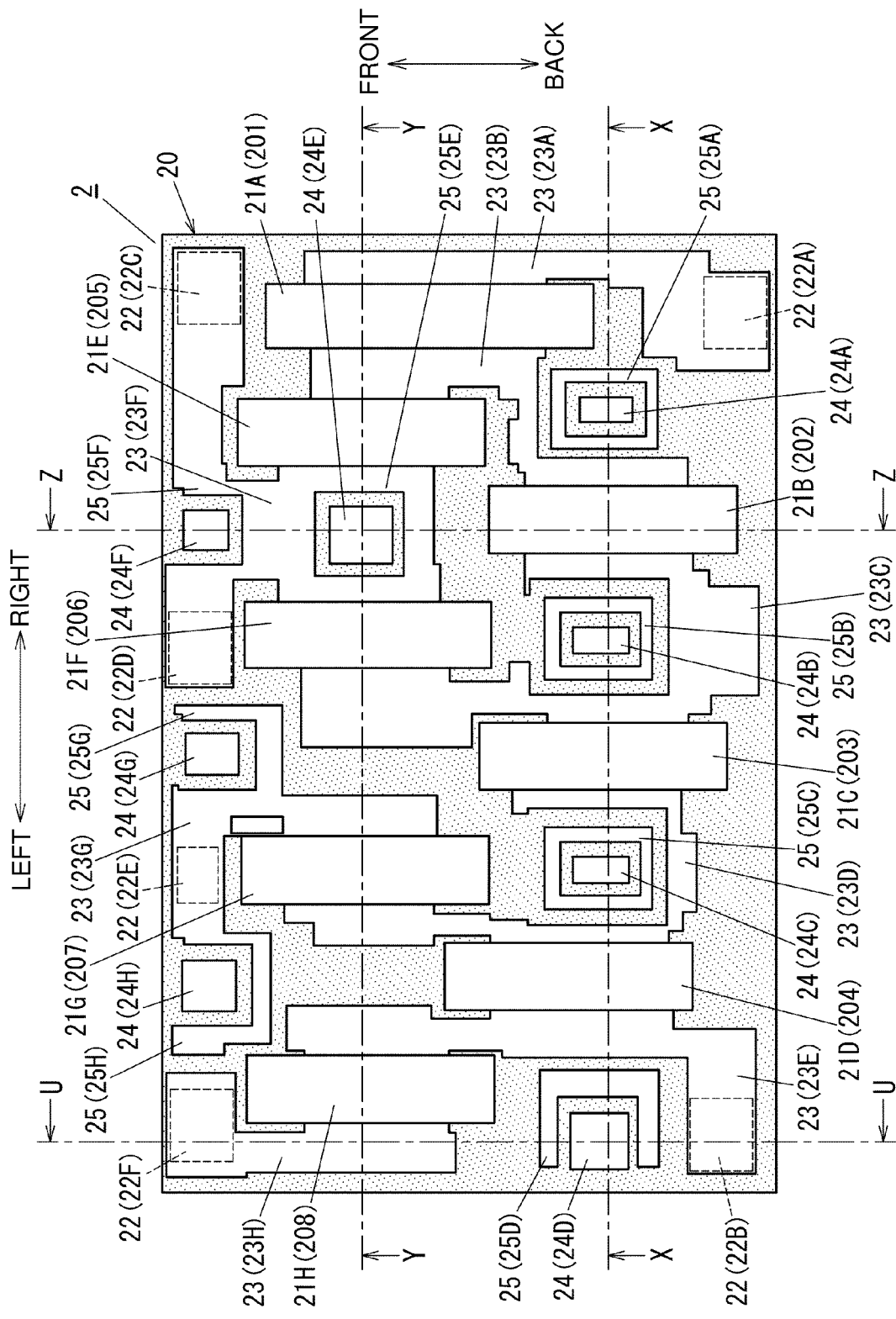
FIG. 3 is a front view of a first filter in the above-described acoustic wave device.
Figure 4:
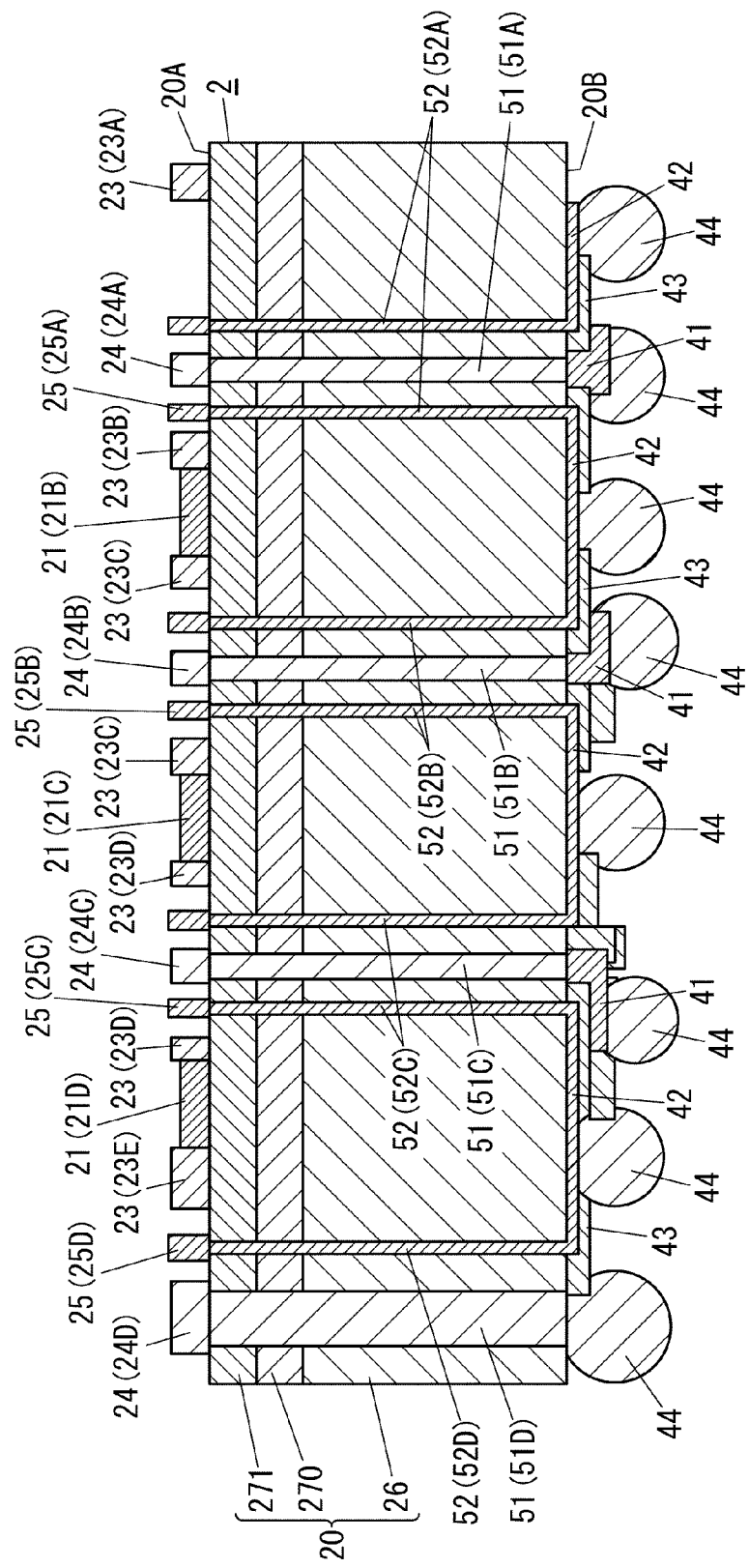
FIG. 4 is a cross-sectional view taken along a line X-X in FIG. 3, illustrating the above-described first filter.
Figure 5:
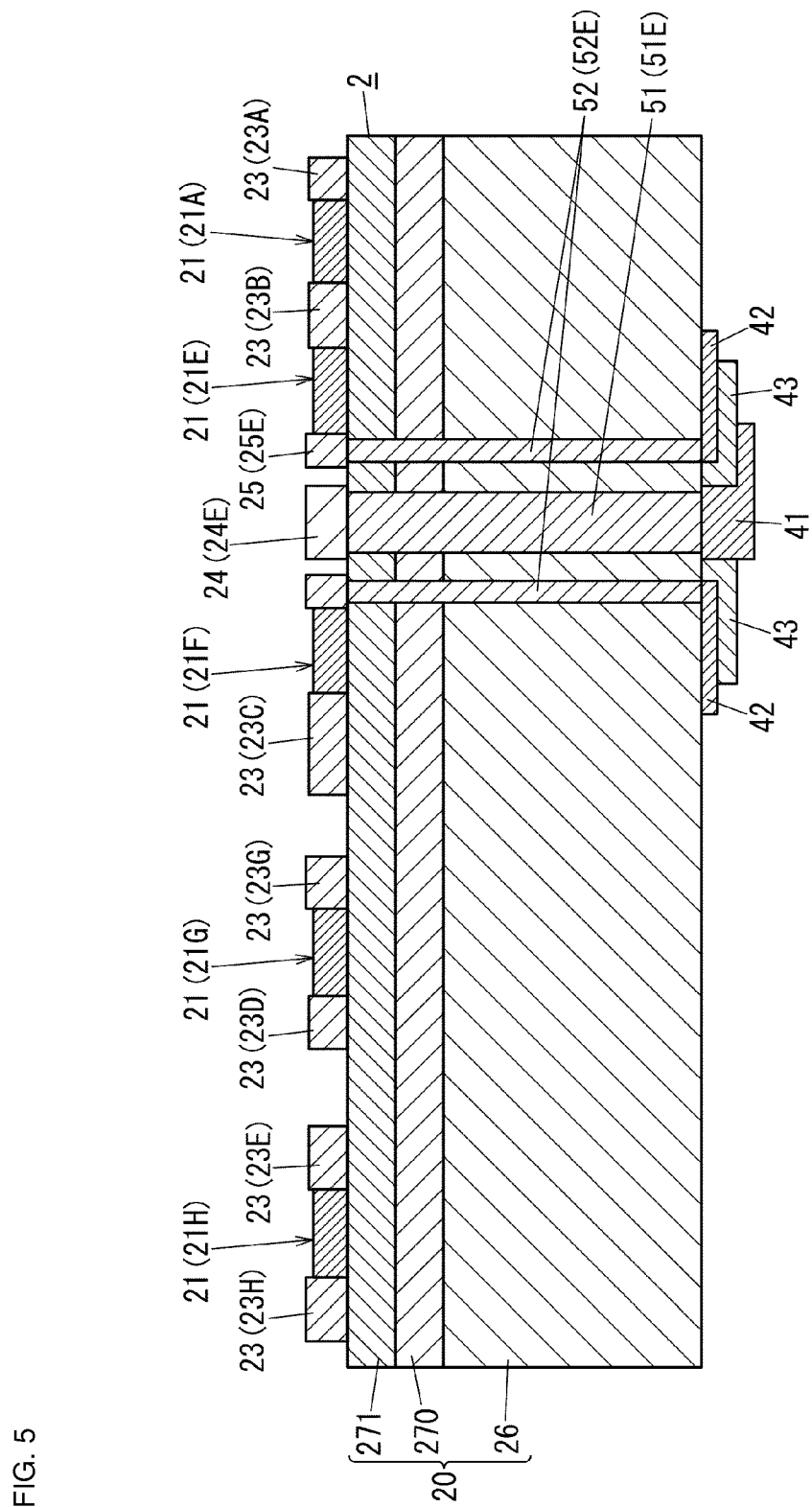
FIG. 5 is a cross-sectional view taken along a line Y-Y in FIG. 3, illustrating the above-described first filter.
Figure 6:
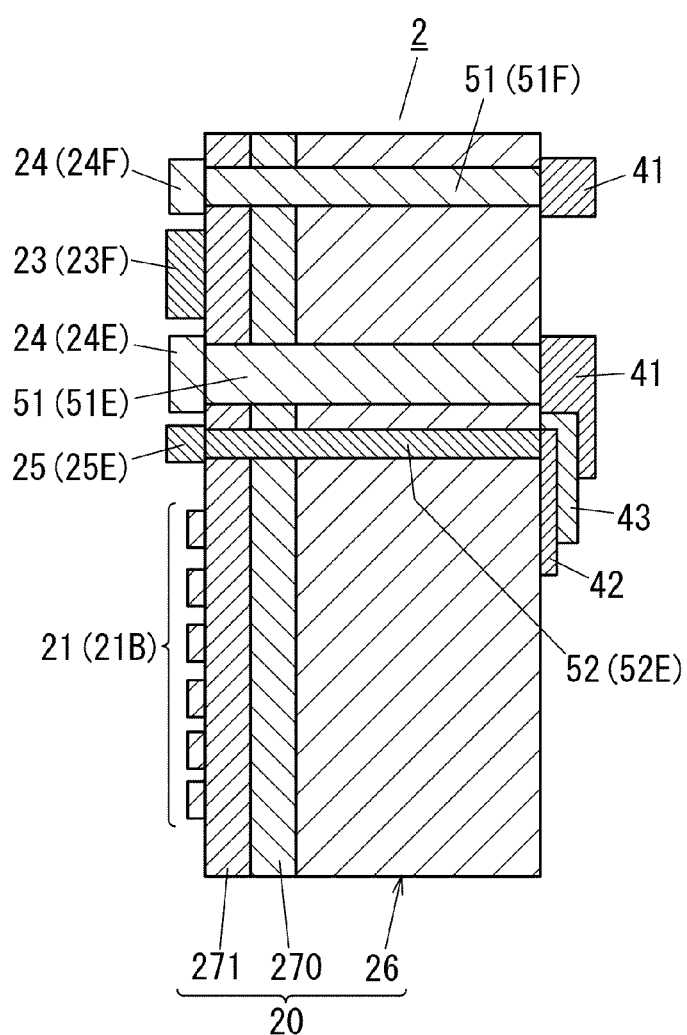
FIG. 6 is a cross-sectional view taken along a line Z-Z in FIG. 3, illustrating the above-described first filter.

In the first filter 2, on the first surface (an upper surface of the piezoelectric film 271 in FIG. 2) of the first substrate 20, a plurality of (eight in an illustrated example) first functional electrodes 21A to 21H, a plurality (six in the illustrated example) of first signal electrodes 22A to 22F, and a plurality of first wiring conductors 23A to 23G are provided (see FIG. 3). The eight first functional electrodes 21A to 21H correspond to the four series arm resonators 201 to 204 and the four parallel arm resonators 205 to 208 illustrated in FIG. 1 in a one-to-one manner. However, in FIG. 3, a shape of each of the first functional electrodes 21A to 21H defined by an IDT electrode and two reflectors is simplified and illustrated as a rectangular shape. In addition, in FIG. 3, a dot pattern is applied in an exposed area in the first surface (a surface of the piezoelectric film 271) of the first substrate 20.

As illustrated in FIG. 3, the first functional electrode 21A is disposed substantially at a center in a front-back direction at one end (right end) in a left-right direction of the first surface 20A of the first substrate 20 so that a longitudinal direction thereof is parallel or substantially parallel to the front-back direction of the first surface 20A. Additionally, the first functional electrodes 21B to 21D are provided so as to be spaced from right to left in a range rearward substantially from the center in the front-back direction of the first surface 20A of the first substrate 20, and a longitudinal direction thereof is parallel or substantially parallel to the front-back direction of the first surface 20A. Further, the first functional electrodes 21E to 21H are disposed so as to be spaced from right to left in a range forward substantially from the center in the front-back direction of the first surface 20A of the first substrate 20, and a longitudinal direction thereof is parallel or substantially parallel to the front-back direction of the first surface 20A.

The first signal electrode 22A to which a reception signal received by an antenna is inputted among the plurality of first signal electrodes 22, is provided on a corner (right rear corner in FIG. 3) of the first surface 20A of the first substrate 20. Further, the first signal electrode 22B from which the first reception signal is outputted among the plurality of first signal electrodes 22, is provided on a corner (left rear corner in FIG. 3) of the first surface 20A of the first substrate 20. Further, the first signal electrodes 22C to 22F electrically connected to a ground (signal ground) among the plurality of first signal electrodes 22 are provided so as to be spaced in the left-right direction at a front end of the first surface 20A of the first substrate 20.

As illustrated in FIG. 1 and FIG. 3, the first wiring conductor 23A among the plurality of first wiring conductors 23 electrically connects the first signal electrode 22A and a first end of the first functional electrode 21A. The first wiring conductor 23B among the plurality of first wiring conductors 23 electrically connects a second end of the first functional electrode 21A and first ends of the respective first functional electrodes 21B and 21E. The first wiring conductor 23C among the plurality of first wiring conductors 23 electrically connects a second end of the first functional electrode 21B and first ends of the respective first functional electrodes 21C and 21F. The first wiring conductor 23D among the plurality of first wiring conductors 23 electrically connects a second end of the first functional electrode 21C and first ends of the respective first functional electrodes 21D and 21G. The first wiring conductor 23E among the plurality of first wiring conductors 23 electrically connects a second end of the first functional electrode 21D and a first end of the first functional electrode 21H and the first signal electrode 22B. The first wiring conductor 23F among the plurality of first wiring conductors 23 electrically connects second ends of the respective first functional electrodes 21E and 21F and the first signal electrodes 22C and 22D. The first wiring conductor 23G among the plurality of first wiring conductors 23 electrically connects a second end of the first functional electrode 21G and the first signal electrode 22E. The first wiring conductor 23H among the plurality of first wiring conductors 23 electrically connects the first signal electrode 22F and a second end of the first functional electrode 21H.

Further, a plurality of relay electrodes 24A to 24H and a plurality of ground electrodes 25A to 25H are provided on the first surface 20A of the first substrate 20. Each of the plurality of relay electrodes 24A to 24H, on the first surface 20A of the first substrate 20, is provided at a position where a necessary insulation distance can be secured between each of the plurality of first functional electrodes 21, the plurality of first signal electrodes 22, and the plurality of first wiring conductors 23 (see FIG. 3). Specifically, each of the relay electrodes 24A to 24H is provided between the two first functional electrodes 21 adjacent to each other in a lateral direction (a left-right direction in FIG. 3) of the first substrate 20. Further, each of the relay electrodes 24A to 24H is electrically connected to the corresponding second signal electrode 32 among the plurality of second signal electrodes 32 of the second filter 3 by a bump 36 (see FIG. 2). Note that, the bump is preferably made of a conductive material such as solder, gold or copper, for example.

The plurality of ground electrodes 25A to 25H are provided between the corresponding relay electrodes 24A to 24H among the plurality of relay electrodes 24A to 24H, and the first functional electrodes 21, the first signal electrodes 22, and the first wiring conductors 23, respectively (see FIG. 3). Specifically, the ground electrodes 25A to 25H are provided, on the first surface 20A of the first substrate 20, so as to surround the corresponding relay electrodes 24A to 24H from three or four sides of the relay electrodes 24A to 24H, respectively. For example, the four relay electrodes 24A to 24C, and 24E are surrounded by the first functional electrodes 21A to 21G and the first wiring conductors 23A to 23D and 23F from four sides, in the left-right direction and the front-back direction of the first surface 20A of the first substrate 20. Thus, the four ground electrodes 25A to 25C, and 25E corresponding to the four relay electrodes 24A to 24C, and 24E surround the corresponding relay electrodes 24A to 24C, and 24E from the four sides (left-right direction and front-back direction of the first substrate 20). On the other hand, the first functional electrode 21, the first signal electrode 22, and the first wiring conductor 23 are not provided between a left end of the relay electrode 24D and a left end of the first substrate 20. Thus, the ground electrode 25D surrounds the relay electrode 24D from three sides (right direction and front-back direction in FIG. 3) except for a left direction of the first substrate 20. Similarly, the first functional electrode 21, the first signal electrode 22, and the first wiring conductor 23 are not provided between a front end of the three relay electrodes 24F to 24H and the front end of the first substrate 20. Thus, the three ground electrodes 25F to 25H surround the corresponding relay electrodes 24F to 24H from three sides (back direction and left-right direction in FIG. 3) except for a front side of the first substrate 20. However, among the eight ground electrodes 25A to 25H, four of the ground electrodes 25E to 25H adjacent to the respectively corresponding four relay electrodes 24E to 24H of the first filter 2 are integrally provided with the corresponding first wiring conductors 23F and 23G of the four first wiring conductors 23E to 23H (see FIG. 3).

Figure 7:
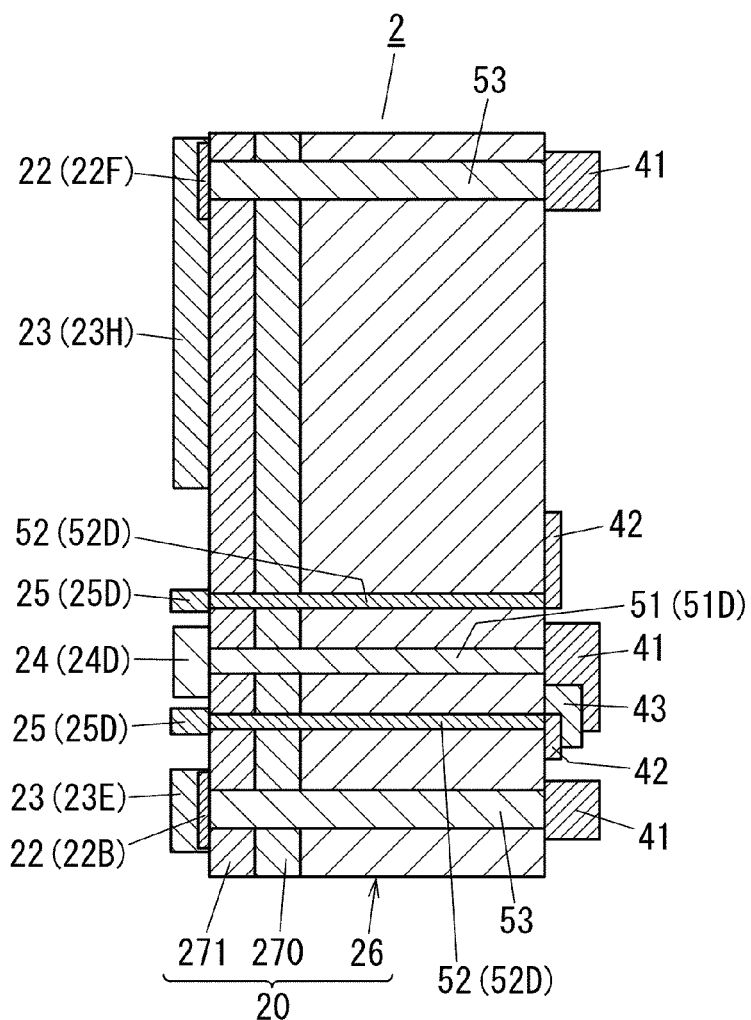
FIG. 7 is a cross-sectional view taken along a line U-U in FIG. 3, illustrating the above-described first filter.
Figure 8A:
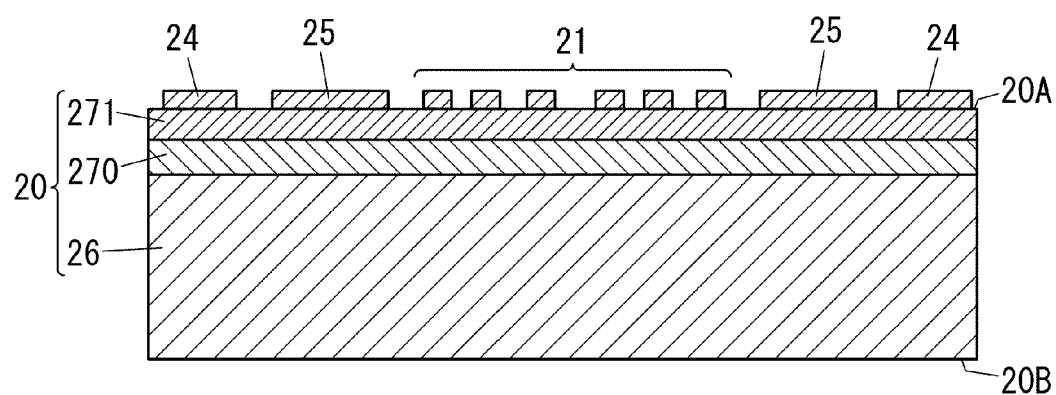
FIGS. 8A and 8B are cross-sectional views for explaining a manufacturing process of the above-described first filter.
Figure 8B:
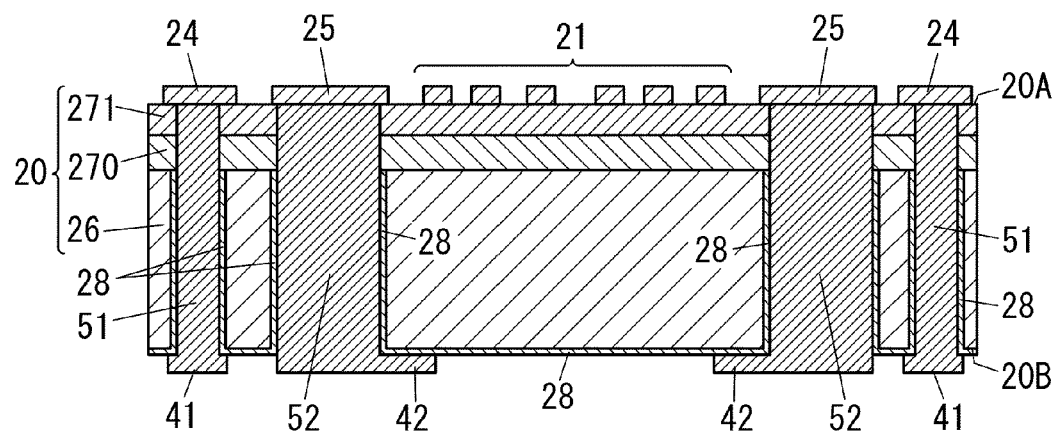

Here, as illustrated in FIG. 4 to FIG. 7, a plurality of signal terminals 41 and a plurality of ground terminals 42 for the second filter 3 are provided, on a second surface 20B of the first substrate 20 opposed to the first surface 20A of the first substrate 20 in a laminating direction. Note that, as illustrated in FIG. 7, a plurality of the signal terminals 41 for the first filter 2 are also provided on the second surface 20B of the first substrate 20. Although not illustrated in FIG. 4 to FIG. 7, an insulating film made of a silicon nitride film or a silicon oxide film, for example, is provided between each of the signal terminals 41 and the second surface 20B of the first substrate 20, and between each of the ground terminals 42 and the second surface 20B of the first substrate 20. By this insulating film, each of the signal terminals 41 and each of the ground terminals 42 are electrically insulated from the first substrate 20. Further, as illustrated in FIG. 4 to FIG. 7, an insulating film 43 made of a silicon nitride film or a silicon oxide film, for example, is provided so as to cover a portion of a surface (lower surface in FIG. 4) of each of the ground terminals 42. Additionally, a portion of each of the signal terminals 41 is laminated on the ground terminal 42 with the insulating film 43 interposed therebetween (see FIG. 5 to FIG. 7). That is, each of the signal terminals 41 is electrically insulated from each of the ground terminals 42 by the insulating film 43.

Further, the first substrate 20 is provided with a plurality of first through-electrodes 51, a plurality of second through-electrodes 52, and a plurality of third through-electrodes 53 (see FIG. 4 to FIG. 7). As illustrated in FIG. 4 to FIG. 7, the plurality of first to third through-electrodes 51 to 53 penetrate the first substrate 20 along the laminating direction. The first through-electrode 51 electrically connects the relay electrode 24 and the signal terminal 41 for the second filter 3 corresponding to the relay electrode 24. The second through-electrode 52 electrically connects the ground electrode 25 to the ground terminal 42 corresponding to the ground electrode 25. The third through-electrode 53 electrically connects the first signal electrode 22 to the signal terminal 41 for the first filter 2 corresponding to the first signal electrode 22 (see FIG. 7). Further, each of the second through-electrodes 52 is provided around the first through-electrodes 51 in the first substrate 20. Each of the second through-electrodes 52 is electrically insulated from the first through-electrode 51 and the third through-electrode 53. That is, although not illustrated in FIG. 2 and FIG. 4 to FIG. 7, an insulating film made of a silicon oxide film or the like, for example, is provided on a boundary surface between the first through-electrode 51, the second through-electrode 52 and the third through-electrode 53, and the first substrate 20. By this insulating film, the first through-electrode 51, the second through-electrode 52, and the third through-electrode 53 are electrically insulated from the first substrate 20 made of a silicon substrate, and the first through-electrode 51, the second through-electrode 52, and the third through-electrode 53 are electrically insulated from each other.

Here, four first through-electrodes 51A to 51C, and 51E electrically connected to the four relay electrodes 24A to 24C, and 24E respectively, among the plurality of first through-electrodes 51, are each surrounded from four sides by the second through-electrodes 52 in the left-right direction and the front-back direction of the first substrate 20. Accordingly, the four second through-electrodes 52A to 52C, and 52E corresponding to the four first through-electrodes 51A to 51C, and 51E surround the respectively corresponding first through-electrodes 51A to 51C, and 51E, from the four sides (left-right direction and front-back direction of the first substrate 20) (see FIG. 4 to FIG. 6). On the other hand, the four first through-electrodes 51D, 51F to 51H (however, 51G and 51H are not illustrated) electrically connected to the remaining four relay electrodes 24D, and 24F to 24H are each surrounded only from three sides by the second through-electrodes 52 in the left-right direction and the front-back direction of the first substrate 20. Accordingly, the four second through-electrodes 52D, 52F to 52H (however, 52F to 52H are not illustrated) corresponding to the four first through-electrodes 51D, and 51F to 51H surround the respectively corresponding first through-electrodes 51D, and 51F to 51H from three sides, in the left-right direction and the front-back direction of the first substrate 20.

A structure in which the first filter 2 and the second filter 3 are laminated is housed in a resin or ceramic package that is not illustrated. A signal electrode and a ground electrode are provided on a bottom surface of the package. Additionally, the plurality of signal terminals 41 and the plurality of ground terminals 42 of the first filter 2 are electrically connected to signal pads and ground pads provided on an inner bottom surface of the package with bumps 44 interposed therebetween. That is, the plurality of signal terminals 41 and the plurality of ground terminals 42 provided on the second surface 20B of the first substrate 20 are electrically connected to terminals on the bottom surface of the package with the pads on the inner bottom surface of the package interposed therebetween.

Here, a non-limiting example of a manufacturing method (manufacturing process) of the acoustic wave device 1 will be briefly described. First, the first functional electrode 21, a first signal electrode, a first wiring conductor, the relay electrode 24, and the ground electrode 25 are formed on the piezoelectric film 271 of the first substrate 20. For example, after electroless plating is thinly performed on the piezoelectric film 271, a conductive pattern is formed by electroplating and etching, thereby forming the first functional electrode 21, the first signal electrode, the first wiring conductor, the relay electrode 24, and the ground electrode 25 on the piezoelectric film 271 (see FIG. 8A).

Subsequently, for the first substrate 20, by a deep Reactive Ion Etching (RIE) method or the like, for example, a through-hole (via) is formed that penetrates from the second surface 20B (a surface of the support substrate 26) of the first substrate 20 to the first surface 20A of the first substrate 20. Additionally, an insulating film 28 is formed on the second surface 20B of the first substrate 20 and an inner peripheral surface of each through-hole. Then, each through-hole is plated with via filling with the insulating film 28 interposed therebetween to form the first through-electrode 51, the second through-electrode 52, and a third through-electrode (see FIG. 8B). Further, a conductive layer electrically connected to the first through-electrode 51, the second through-electrode 52, and the third through-electrode is formed on the insulating film 28 on the second surface 20B of the first substrate 20. Note that, these conductive layers define and function as the signal terminals 41 and the ground terminals 42. Finally, a second signal electrode of the second filter 3 and the relay electrode 24 of the first substrate 20 are bonded to each other by a bump, so that the second filter 3 is stacked (laminated) on the first filter 2 (see FIG. 2). In this manner, the acoustic wave device 1 having the laminated structure of the first filter 2 and the second filter 3 is able to be manufactured.

In the acoustic wave device 1, while reception signals inputted from an antenna pass through a signal line of the first filter 2 and a signal line of the second filter 3, the reception signals are filtered by the first filter 2 and the second filter 3. Then, the reception signal filtered by the first filter 2 (first reception signal) and the reception signal filtered by the second filter 3 (second reception signal) are outputted from the acoustic wave device 1. Here, the signal line of the first filter 2 is a conductor including a cable through which a reception signal before the filtering, a reception signal during the filtering, and the first reception signal after the filtering pass, specifically, the first functional electrode 21, the first signal electrode 22, and the first wiring conductor 23. Further, the signal line of the second filter 3 is a conductor including a cable through which a reception signal before the filtering, a reception signal during the filtering, and the second reception signal after the filtering pass, specifically, the second functional electrode 31, the second signal electrode 32, and the second wiring conductor 33. Here, since reception signals including the first reception signal and the second reception signal are high frequency signals, there is a possibility that reception signals flowing through the signal line of the first filter 2 (a reception signal during the filtering and the first reception signal) may be spatially conducted to the signal line of the second filter 3. Similarly, there is a possibility that reception signals flowing through the signal line of the second filter 3 (a reception signal during the filtering and the second reception signal) may be spatially conducted to the signal line of the first filter 2.

Thus, in the acoustic wave device 1, the ground electrode 25 electrically connected to the signal ground is provided between the signal line of the first filter 2 and the signal line of the second filter 3. That is, the signal line of the second filter 3 is electromagnetically shielded against the signal line of the first filter 2 by the ground electrode 25. As a result, the acoustic wave device 1 reduces a reception signal that is spatially conducted between the signal line of the first filter 2 and the signal line of the second filter 3, and thus is able to reduce or prevent deterioration in isolation characteristics of the first filter 2 and the second filter 3.

Further, in the acoustic wave device 1, the second through-electrode 52 electrically connected to the signal ground is provided in the first substrate 20 so as to surround the first through-electrode 51 penetrating through the first substrate 20. That is, the first through-electrode 51, that is a portion of the signal line of the second filter 3, is electromagnetically shielded by the second through-electrode 52. Thus, the acoustic wave device 1 can further reduce the reception signal that is spatially conducted between the signal line of the first filter 2 and the signal line of the second filter 3 through the first through-electrode 51 and the third through-electrode provided in the first substrate 20. As a result, the acoustic wave device 1 is able to further reduce or prevent the deterioration in the isolation characteristics of the first filter 2 and the second filter 3.

Figure 9A:
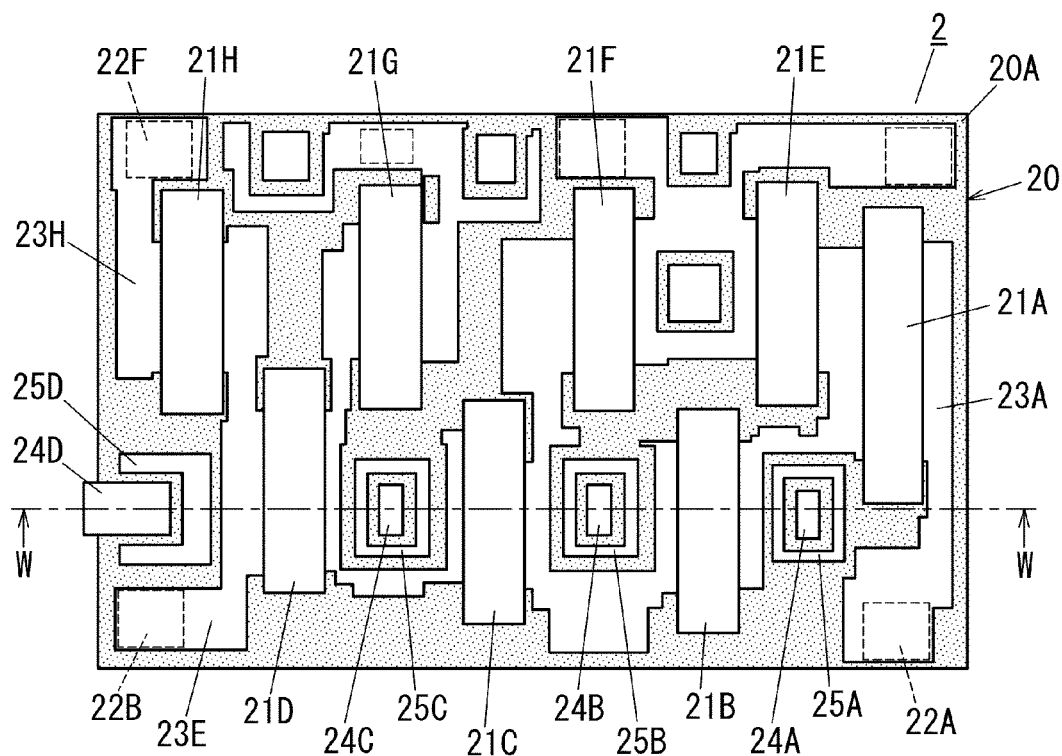
FIG. 9A is a front view of a modified example of the above-described first filter.
Figure 9B:
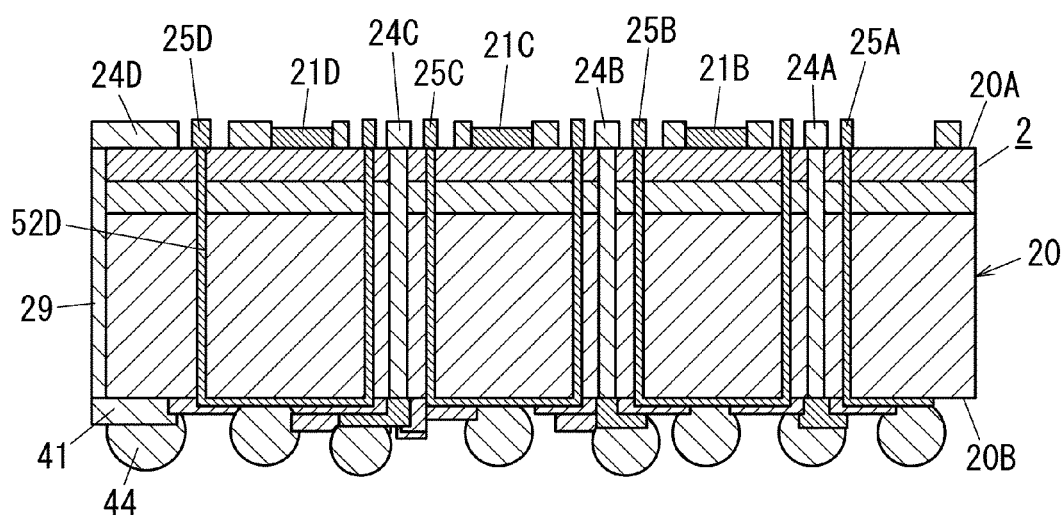
FIG. 9B is a cross-sectional arrow view taken along a line W-W in FIG. 9A.

The signal line of the second filter 3 provided in the first substrate 20 is not limited to the through-electrode. For example, as illustrated in FIGS. 9A and 9B, a conductor 29 extending from the first surface 20A of the first substrate 20 to the second surface 20B may be provided along a side surface of the first substrate 20 at a left end in the left-right direction in place of the first through-electrode 51D. That is, the relay electrode 24D provided on the first surface 20A of the first substrate 20 is electrically connected to the signal terminal 41 provided on the second surface 20B of the first substrate 20 with the conductor 29 interposed therebetween. Further, the conductor 29 is surrounded by the second through-electrode 52D provided in the first substrate 20 from three sides (front and back directions and a right direction), and is electromagnetically shielded. Thus, even when the conductor 29 provided on a side surface of the first substrate 20 is included in the signal line of the second filter 3, the acoustic wave device 1 is able to reduce or prevent the deterioration in the isolation characteristics of the first filter 2 and the second filter 3.

Next, a modified example of the acoustic wave device 1 according to a preferred embodiment of the present invention will be described with reference to FIG. 10. However, the acoustic wave device 1 according to the modified example has substantially common structure to that of the acoustic wave device 1 according to the above-described preferred embodiment. Thus, elements common to those of the acoustic wave device 1 according to the preferred embodiment are denoted by common reference numerals and illustration and description thereof will be appropriately omitted.

Figure 10:
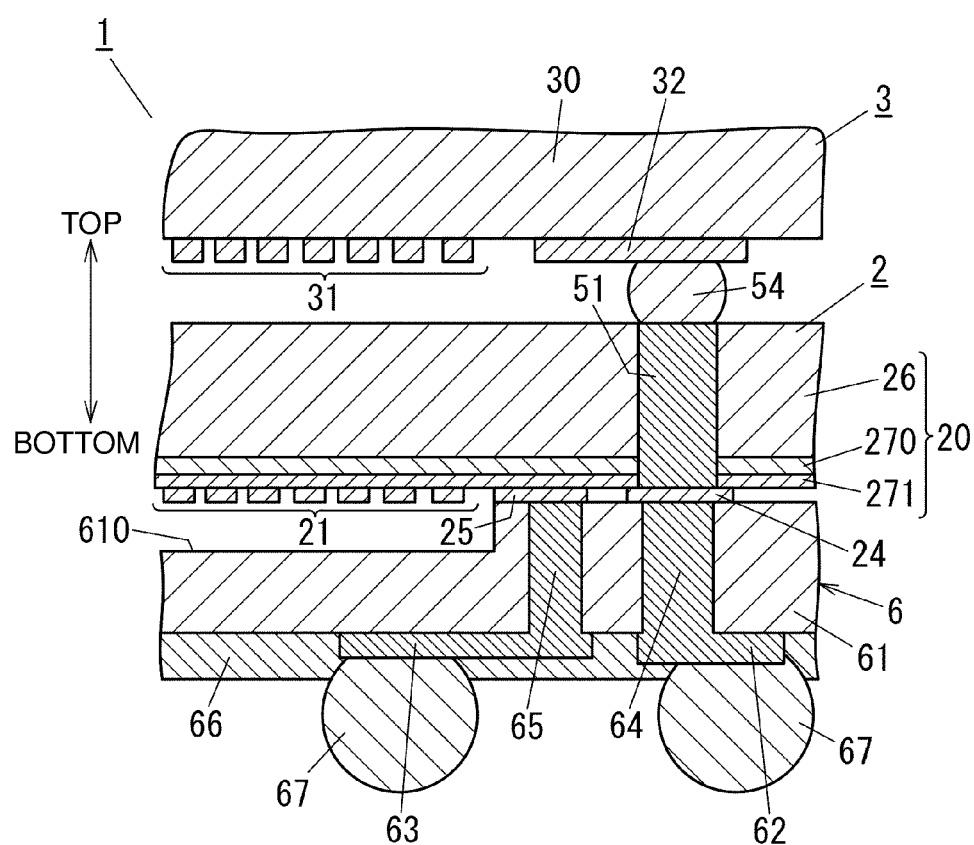
FIG. 10 is a partially omitted cross-sectional view of a modified example of the above-described acoustic wave device.

As illustrated in FIG. 10, the acoustic wave device 1 according to the modified example includes a support member 6 supporting a laminated body of the first filter 2 and the second filter 3 in a laminating direction (vertical direction in FIG. 10). The first filter 2 is supported by the support member 6 such that a first surface of the first filter 2 (first surface of the first substrate 20) is opposed to a first surface of the support member 6 (upper surface in FIG. 10). The laminated bodies of the first filter 2 and the second filter 3 are configured such that a second surface of the first substrate 20 (surface of the support substrate 26) and a first surface of the second substrate 30 are opposed to each other in the laminating direction, and the first filter 2 and the second filter 3 are laminated. Note that, the second signal electrode 32 of the second filter 3 and the first through-electrode 51 of the first filter 2 are bonded to each other by a bump 54.

The support member 6 includes a plate-shaped main body 61. The main body 61 is preferably made of a material having electrical insulation properties and having a value of a coefficient of linear expansion close to that of a silicon substrate defining the support substrate 26 of the first filter 2, for example, a glass substrate or the like.

A recess 610 is provided in a portion of a first surface (the upper surface in FIG. 10) of the main body 61. The main body 61 supports the first filter 2 such that the recess 610 is opposed to the first functional electrode 21 provided on the first surface of the first filter 2. Respective end portions of a first through-conductor 64 and a second through-conductor 65 are exposed to a portion where the recess 610 is not provided in the first surface of the main body 61. The first through-conductor 64 and the second through-conductor 65 penetrate the main body 61 along the laminating direction. The first through-conductor 64 is electrically connected to the relay electrode 24 of the first filter 2, at the end portion exposed to the first surface of the main body 61. Further, the second through-conductor 65 is electrically connected to the ground electrode 25 of the first filter 2, at the end portion exposed to the first surface of the main body 61.

One or more terminal electrodes 62 and ground electrodes 63 are provided on a second surface of the main body 61 (lower surface in FIG. 10). The terminal electrode 62 is electrically connected to the first through-conductor 64 on the second surface of the main body 61. Further, the ground electrode 63 is electrically connected to the second through-conductor 65 on the second surface of the main body 61. Further, the second surface of the main body 61 is covered with an insulating layer 66 made of a material having electrical insulation properties. Note that, each of the terminal electrode 62 and the ground electrode 63 is electrically connected to a corresponding pad among a plurality of pads of an interposer (not illustrated) with a bump 67 interposed therebetween.

As described above, also in the acoustic wave device 1 according to the modified example, the ground electrode 25 and the second through-conductor 65 electrically connected to a signal ground are provided between a signal line of the first filter 2 and a signal line of the second filter 3. Thus, the acoustic wave device 1 according to the modified example also reduces a reception signal that is spatially conducted between the signal line of the first filter 2 and the signal line of the second filter 3, thus reducing or preventing deterioration in isolation characteristics of the first filter 2 and the second filter 3.

Note that, the acoustic wave device 1 according to the above-described preferred embodiment and modified example is provided by laminating the two acoustic wave elements (first filter 2 and second filter 3), but may be provided by laminating three or more acoustic wave elements. For example, three or more acoustic wave elements (filters) having pass bands different from each other may be laminated to define the acoustic wave device 1.

Here, in the present preferred embodiment and modified example, the acoustic wave device 1, that is a filter device for reception for dividing reception signals received by an antenna into a plurality of frequency bands and outputting, is exemplified, but the acoustic wave device is not limited to the filter device for reception. For example, the acoustic wave device 1 may be a filter device for transmission configured such that a plurality of filters for transmission are connected in parallel to one antenna. Alternatively, the acoustic wave device 1 may also be a duplexer or a multiplexer to share one antenna in both transmission and reception, by using the first filter 2 as a reception filter and the second filter 3 as a transmission filter. Further, in the first filter 2, the first signal electrodes 22A to 22F are not essential elements. For example, the third through-electrode 53 and the first wiring conductor 23 may be directly and electrically connected to each other on the first surface 20A of the first substrate 20.

As is apparent from the above-described preferred embodiments, the acoustic wave device (1) includes a plurality of acoustic wave elements including a first acoustic wave element (first filter 2) and a second acoustic wave element (second filter 3). The first acoustic wave element (first filter 2) and the second acoustic wave element (second filter 3) are laminated along a predetermined direction. The first acoustic wave element (first filter 2) includes a first substrate (20) having piezoelectricity at least in a portion thereof, and the first functional electrode (21) provided on one main surface (first surface 20A) of the first substrate (20). The first acoustic wave element (first filter 2) is provided on the first substrate (20), and includes a first wiring conductor (23) electrically connected to the first functional electrode (21). The second acoustic wave element (second filter 3) includes a second substrate (30) having piezoelectricity at least in a portion, and a second functional electrode (31) provided on one main surface (the first surface 30A) of the second substrate (30). The first acoustic wave element (first filter 2) further includes a relay electrode (24) provided on the one main surface (first surface 20A) of the first substrate (20) and electrically connected to the second functional electrode (31), and a ground electrode (25) provided on the one main surface (first surface 20A) of the first substrate (20). The ground electrode (25) is provided between at least one of the first functional electrode (21) and the first wiring conductor (23), and the relay electrode (24), and is electrically insulated from the relay electrode (24).

In an acoustic wave device (1) according to a preferred embodiment of the present invention, the ground electrode

(25) is provided between a signal line of the first acoustic wave element (first filter 2) and a signal line of the second acoustic wave element (second filter 3). In addition, the ground electrode (25) is electrically insulated from the relay electrode (24). That is, by electrically connecting the ground electrode (25) to a signal ground, the acoustic wave device (1) according to the present preferred embodiment is able to reduce a signal that is spatially conducted between the signal line of the first acoustic wave element (first filter 2) and the signal line of the second acoustic wave element (second filter 3). As a result, the acoustic wave device (1) according to the present preferred embodiment is able to reduce or prevent deterioration in isolation characteristics.

In an acoustic wave device (1) according to a preferred embodiment of the present invention, the ground electrode (25) is electrically connected to the first functional electrode (21).

In an acoustic wave device (1) according to a preferred embodiment of the present invention, the first acoustic wave element (first filter 2) is provided on the first substrate (20), and further includes a first signal electrode (22) electrically connected to the first functional electrode (21) with the first wiring conductor (23) interposed therebetween. The second acoustic wave element (second filter 3) is provided on the second substrate (30), and further includes a second wiring conductor (33) electrically connected to the second functional electrode (31), and a second signal electrode (32) provided on the second substrate (30), and electrically connected to the second functional electrode (31) with the second wiring conductor (33) interposed therebetween.

In an acoustic wave device (1) according to a preferred embodiment of the present invention, the first acoustic wave element (first filter 2) includes a signal terminal (41) provided on another main surface (second surface 20B) opposed to the one main surface (first surface 20A) of the first substrate (20). The first acoustic wave element (first filter 2) includes a ground terminal (42) provided on the other main surface (second surface 20B) of the first substrate (20). The first acoustic wave element (first filter 2) includes a first through-electrode (51) that penetrates the first substrate (20) along a laminating direction, and electrically connects the relay electrode (24) and the signal terminal (41). The first acoustic wave element (first filter 2) includes a second through-electrode (52) that penetrates the first substrate (20) along the direction of laminating the first acoustic wave element (first filter 2) and the second acoustic wave element (second filter 3), and electrically connects the ground electrode (25) and the ground terminal (42). The second through-electrode (52) is electrically insulated from the first through-electrode (51).

In an acoustic wave device (1) according to a preferred embodiment of the present invention, the second through-electrode (52) provided in the first substrate (20) together with the first through-electrode (51) included in the signal line of the second acoustic wave element (second filter 3) are electrically connected to the signal ground, thus the deterioration in the isolation characteristics is able to be reduced or prevented.

In an acoustic wave device (1) according to a preferred embodiment of the present invention, the second through-electrode (52) is provided around the first through-electrode (51) in the first substrate (20).

In an acoustic wave device (1) according to a preferred embodiment of the present invention, the second through-electrode (52) is provided around the first through-electrode (51), thus the deterioration in the isolation characteristics is able to be further reduced or prevented.

In an acoustic wave device (1) according to a preferred embodiment of the present invention, the first acoustic wave element (first filter 2) further includes a third through-electrode (53) that penetrates the first substrate (20) along the laminating direction and is electrically connected to the first wiring conductor (23).

In an acoustic wave device (1) according to a preferred embodiment of the present invention, a portion of the signal line of the first acoustic wave element (first filter 2) is defined by the third through-electrode (53) penetrating the first substrate (20), thus wiring of the signal line can be reduced.

In an acoustic wave device (1) according to a preferred embodiment of the present invention, at least one of the first substrate (20) and the second substrate (30) includes a support substrate (26; 34) and a piezoelectric film (271; 351) provided directly or indirectly on the one main surface of the support substrate (26; 34).

In an acoustic wave device (1) according to a preferred embodiment of the present invention, each of the support substrate (26; 34) and the piezoelectric film (271; 351) can be made of a suitable material, compared to a case where an entirety of the first substrate (20) or the second substrate (30) is made of a piezoelectric substrate.

In an acoustic wave device (1) according to a preferred embodiment of the present invention, at least one substrate further includes a low acoustic velocity film (270; 350) between the support substrate (26; 34) and the piezoelectric film (271; 351). The low acoustic velocity film (270; 350) is made of a material that propagates an acoustic wave at a propagation speed lower than a propagation speed of an acoustic wave propagating through the piezoelectric film (271; 351). The support substrate (26; 34) is made of a material that propagates an acoustic wave at a propagation speed higher than a propagation speed of an acoustic wave propagating through the piezoelectric film (271; 351).

In an acoustic wave device (1) according to a preferred embodiment of the present invention, a Q value of the first acoustic wave element (first filter 2) or the second acoustic wave element (second filter 3) can be increased.

In an acoustic wave device (1) according to a preferred embodiment of the present invention, at least one of the first functional electrode (21) and the second functional electrode (31) is an IDT electrode.

In an acoustic wave device (1) according to a preferred embodiment of the present invention, the first acoustic wave element (first filter 2) or the second acoustic wave element (second filter 3) can be a filter (acoustic wave filter) having a small insertion loss by using the acoustic wave element having a high Q value.

An acoustic wave device (1) according to a preferred embodiment of the present invention, further includes a support member (6) supporting the laminated body of the first acoustic wave element (first filter 2) and the second acoustic wave element (second filter 3) in the laminating direction. The laminated body (the first filter 2 and the second filter 3) is supported by the support member (6) such that the first acoustic wave element (first filter 2) is opposed to the first surface of the support member (6). The support member (6) includes a terminal electrode (62) provided on the second surface opposed to the first surface of the support member (6) in the laminating direction, and a ground electrode (63) provided on the second surface of the support member (6). The support member (6) includes a first through-conductor (64) penetrating the support member (6) along the laminating direction, and electrically connects the relay electrode (24) of the first acoustic wave element (first filter 2) to the terminal electrode (62). The support member (6) includes a second through-conductor (65) penetrating the support member (6) along the laminating direction, and electrically connects the ground electrode (25) of the first acoustic wave element (first filter 2) and the ground electrode (63) provided on the second surface of the support member (6).

In an acoustic wave device (1) according to a preferred embodiment of the present invention, the laminated body of the first acoustic wave element (first filter 2) and the second acoustic wave element (second filter 3) is supported by the support member (6), thus mechanical strength of the laminated body is improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a plurality of acoustic wave elements including a first acoustic wave element and a second acoustic wave element; wherein
   the second acoustic wave element is laminated on the first acoustic wave element;
   the first acoustic wave element includes:
      a first substrate having piezoelectricity at least in a portion thereof;
      a first functional electrode provided on one main surface of the first substrate;
      a first wiring conductor provided on the first substrate, and electrically connected to the first functional electrode; and
      a first signal electrode provided on the first substrate, and electrically connected to the first functional electrode with the first wiring conductor interposed therebetween;
   the second acoustic wave element includes:
      a second substrate having piezoelectricity at least in a portion thereof;
      a second functional electrode provided on one main surface of the second substrate;
      a second wiring conductor provided on the second substrate, and electrically connected to the second functional electrode; and
      a second signal electrode provided on the second substrate, and electrically connected to the second functional electrode with the second wiring conductor interposed therebetween;
   the first acoustic wave element further includes:
      a relay electrode provided on the one main surface of the first substrate, and electrically connected to the second functional electrode; and
      a ground electrode provided on the one main surface of the first substrate; and
   the ground electrode is provided between at least one of the first functional electrode and the first wiring conductor, and the relay electrode, and is electrically insulated from the relay electrode.

2. The acoustic wave device according to claim 1, wherein the ground electrode is electrically connected to the first functional electrode.

3. The acoustic wave device according to claim 1, wherein the first acoustic wave element includes:
   a signal terminal provided on another main surface opposed to the one main surface of the first substrate;
   a ground terminal provided on the other main surface of the first substrate;
   a first through-electrode penetrating the first substrate along a direction of laminating the first acoustic wave element and the second acoustic wave element, and electrically connecting the relay electrode and the signal terminal; and
   a second through-electrode penetrating the first substrate along the direction of laminating the first acoustic wave element and the second acoustic wave element, and electrically connecting the ground electrode and the ground terminal; and
   the second through-electrode is electrically insulated from the first through-electrode.

4. The acoustic wave device according to claim 3, wherein the first acoustic wave element further includes a third through-electrode penetrating the first substrate along the direction of laminating the first acoustic wave element and the second acoustic wave element, and electrically connected to the first wiring conductor.

5. The acoustic wave device according to claim 3, wherein the second through-electrode is provided around the first through-electrode in the first substrate.

6. The acoustic wave device according to claim 1, wherein at least one of the first substrate and the second substrate includes:
   a support substrate; and
   a piezoelectric film directly or indirectly provided on one main surface of the support substrate.

7. The acoustic wave device according to claim 6, wherein the at least one substrate further includes a low acoustic velocity film between the support substrate and the piezoelectric film;
   the low acoustic velocity film is made of a material that propagates an acoustic wave at a propagation speed lower than a propagation speed of an acoustic wave propagating through the piezoelectric film; and
   the support substrate is made of a material that propagates an acoustic wave at a propagation speed higher than a propagation speed of an acoustic wave propagating through the piezoelectric film.

8. The acoustic wave device according to claim 7, wherein the low acoustic velocity film is a dielectric film including silicon dioxide as a main component.

9. The acoustic wave device according to claim 8, wherein a thickness of the low acoustic velocity film has a thickness of about 670 nm.

10. The acoustic wave device according to claim 6, wherein the piezoelectric film is made of a 50° Y-cut X propagation $LiTaO_3$ piezoelectric single crystal or piezoelectric ceramic.

11. The acoustic wave device according to claim 10, wherein the piezoelectric film has a thickness of about 500 nm.

12. The acoustic wave device according to claim 6, wherein the support substrate is a silicon substrate.

13. The acoustic wave device according to claim 12, wherein the support substrate has a thickness of about 120 µm.

14. The acoustic wave device according to claim 1, wherein at least one of the first functional electrode and the second functional electrode is an IDT electrode.

15. The acoustic wave device according to claim 1, further comprising:
   a support that supports a laminated body of the first acoustic wave element and the second acoustic wave element in a direction of laminating the first acoustic wave element and the second acoustic wave element; wherein the laminated body is supported by the support such that the first acoustic wave element is opposed to a first surface of the support; and the support includes:
- a terminal electrode provided on a second surface opposed to the first surface of the support in the direction of laminating the first acoustic wave element and the second acoustic wave element;
- a further ground electrode provided on the second surface of the support;
- a first through-conductor penetrating the support along the direction of laminating the first acoustic wave element and the second acoustic wave element, and electrically connecting the relay electrode of the first acoustic wave element and the terminal electrode; and
- a second through-conductor penetrating the support along the direction of laminating the first acoustic wave element and the second acoustic wave element, and electrically connecting the ground electrode of the first acoustic wave element and the further ground electrode provided on the second surface of the support.

16. The acoustic wave device according to claim 1, wherein the first acoustic wave element is a ladder acoustic wave filter including four series arm resonators and four parallel arm resonators that are connected.

17. The acoustic wave device according to claim 1, wherein the second acoustic wave element is a ladder acoustic wave filter having a pass band lower than a pass band of the first acoustic wave element.

18. The acoustic wave device according to claim 1, wherein the first functional electrode is an interdigital transducer electrode.

* * * * *